(12) United States Patent
Yoshitani et al.

(10) Patent No.: US 10,249,761 B2
(45) Date of Patent: Apr. 2, 2019

(54) THIN-FILM TRANSISTOR SUBSTRATE

(71) Applicant: JOLED INC., Tokyo (JP)

(72) Inventors: Toshiaki Yoshitani, Tokyo (JP); Hiroshi Hayashi, Tokyo (JP); Ryo Koshiishi, Tokyo (JP)

(73) Assignee: JOLED INC., Tokyo (JP)

( * ) Notice: Subject to any disclaimer, the term of this patent is extended or adjusted under 35 U.S.C. 154(b) by 6 days.

(21) Appl. No.: 15/800,604

(22) Filed: Nov. 1, 2017

(65) Prior Publication Data

US 2018/0130910 A1 May 10, 2018

(30) Foreign Application Priority Data

Nov. 10, 2016 (JP) .................................. 2016-219881

(51) Int. Cl.
*H01L 29/786* (2006.01)
*H01L 27/32* (2006.01)

(52) U.S. Cl.
CPC .... *H01L 29/78618* (2013.01); *H01L 27/3262* (2013.01); *H01L 27/3265* (2013.01); *H01L 29/78696* (2013.01)

(58) Field of Classification Search
None
See application file for complete search history.

(56) References Cited

U.S. PATENT DOCUMENTS

| 2010/0244034 | A1 | 9/2010 | Miyairi | |
|---|---|---|---|---|
| 2012/0075261 | A1* | 3/2012 | Ryu | ..................... H01L 27/3276 345/204 |
| 2012/0313100 | A1* | 12/2012 | Liu | ..................... H01L 27/1214 257/59 |
| 2014/0284594 | A1 | 9/2014 | Nakano et al. | |
| 2015/0279872 | A1 | 10/2015 | Kato et al. | |

FOREIGN PATENT DOCUMENTS

| JP | 5-27259 A | 2/1993 |
|---|---|---|
| JP | 2010-251732 A | 11/2010 |
| JP | 2014-183238 A | 9/2014 |
| JP | 2015-191038 A | 11/2015 |

* cited by examiner

*Primary Examiner* — Mounir S Amer
(74) *Attorney, Agent, or Firm* — Hauptman Ham, LLP

(57) ABSTRACT

A thin-film transistor (TFT) substrate is provided which includes: a substrate; a TFT disposed above the substrate; and a capacitor disposed above the substrate and electrically connected with the TFT, wherein the capacitor includes: a lower electrode layer disposed above the substrate and including an electrically conductive material as a main component; an upper electrode layer disposed above and opposed to the lower electrode layer and including, as a main component, an oxide semiconductor material to which electrical conductivity is given; and a capacitor insulating layer disposed between the lower electrode layer and the upper electrode layer. An extension extending outward from at least a portion of the outer edge of the lower electrode layer in plan view is provided to the lower electrode layer. In plan view, the upper electrode layer covers the lower electrode layer except the extension.

20 Claims, 11 Drawing Sheets

(a)

(b)

(c)

(d)

THIN-FILM TRANSISTOR SUBSTRATE

CROSS REFERENCE TO RELATED APPLICATION

The present application is based on and claims priority of Japanese Patent Application No. 2016-219881 filed on Nov. 10, 2016. The entire disclosure of the above-identified application, including the specification, drawings and claims is incorporated herein by reference in its entirety.

FIELD

The present disclosure relates to a thin-film transistor substrate.

BACKGROUND

Thin-film semiconductor devices such as thin-film transistors (TFTs) are conventionally used in active-matrix display devices such as liquid crystal display devices, as well as in solid state imaging devices such as digital cameras. In display devices, a TFT is used, for example, as a switching element for selecting a pixel, a driver transistor for driving a pixel, or as a driver external to the display region.

For example, an organic electroluminescent (EL) display including organic EL elements utilizing an organic light-emitting material differs from a voltage-driven liquid crystal display in that it is a current-driven display device. Therefore, development of a better performing TFT is rapidly progressing. Recent years have seen active development of a TFT using, as a channel layer, an oxide semiconductor, a representative example of which is InGaZnO (for example, see Patent Literature (PTL) 1).

CITATION LIST

Patent Literature

[PTL 1] Japanese Unexamined Patent Application Publication No. 2014-183238

SUMMARY

Technical Problem

A capacitor included in a thin-film transistor substrate includes two electrode layers stacked with an insulating layer interposed therebetween. In this case, if insulation between the two electrode layers is insufficient, the breakdown voltage of the capacitor is reduced or the initial breakdown of the capacitor occurs.

In view of this, it is an object of the present disclosure to provide a thin-film transistor substrate that includes a capacitor having high reliability.

Solution to Problem

In order to achieve the above object, a thin-film transistor substrate according to an aspect of the present disclosure includes: a substrate; a thin-film transistor disposed above the substrate; and a capacitor disposed above the substrate and electrically connected with the thin-film transistor, wherein the capacitor includes: a first electrode layer disposed above the substrate and including an electrically conductive material as a main component; a second electrode layer disposed above and opposed to the first electrode layer and including, as a main component, an oxide semiconductor material to which electrical conductivity is given; and an insulating layer disposed between the first electrode layer and the second electrode layer, an extension extending outward from at least a portion of an outer edge of the first electrode layer in plan view is provided to the first electrode layer, and in plan view, the second electrode layer covers the first electrode layer except the extension.

Advantageous Effects

According to the present disclosure, it is possible to provide a thin-film transistor substrate that includes a capacitor having high reliability.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENT

Hereinafter, a thin-film transistor substrate (TFT substrate) according to an embodiment of the present disclosure will be described in detail with reference to the drawings. Note that the embodiment described below shows a specific example of the present disclosure. Therefore, the numerical values, shapes, materials, structural elements, the arrangement and connection of the structural elements, processes (steps), the processing order of the processes, etc., illustrated in the embodiment below are mere examples, and are therefore not intended to limit the present disclosure. As such, among the structural elements in the embodiment below, structural elements not recited in the independent claim indicating the broadest inventive concept will be described as arbitrary structural elements.

Note also that each figure is a schematic illustration and not necessarily a precise illustration. Accordingly, for example, the scale is not necessarily the same for each figure or precise with respect to the real size. Furthermore, in the figures, essentially the same elements are given the same reference signs, and duplicate descriptions are omitted or simplified.

Note that in the present Description, the terms "above" and "below" do not refer to the up direction (vertically up) and the down direction (vertically down) in the spatial recognition in the absolute sense, and are used as terms defined according to a relative positional relationship based on the stacking order of layers in a stacked layer structure. Moreover, the terms "above" and "below" are used not only when two structural elements are disposed apart from each other and there is another structural element between the two structural elements, but also when two structural elements are disposed in close contact with each other and there is no other element between the two structural elements.

Embodiment

First, a configuration of an organic EL display device will be described as an example of a display device including a TFT substrate according to the present embodiment.

[1. Organic EL Display Device]

Figure 1:
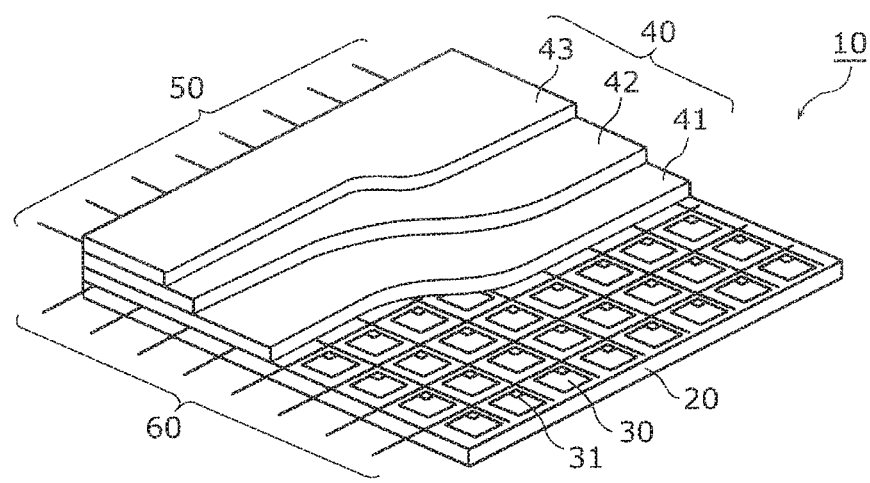
FIG. 1 is a partially cut-out perspective view of an organic EL display device according to an embodiment.
Figure 2:
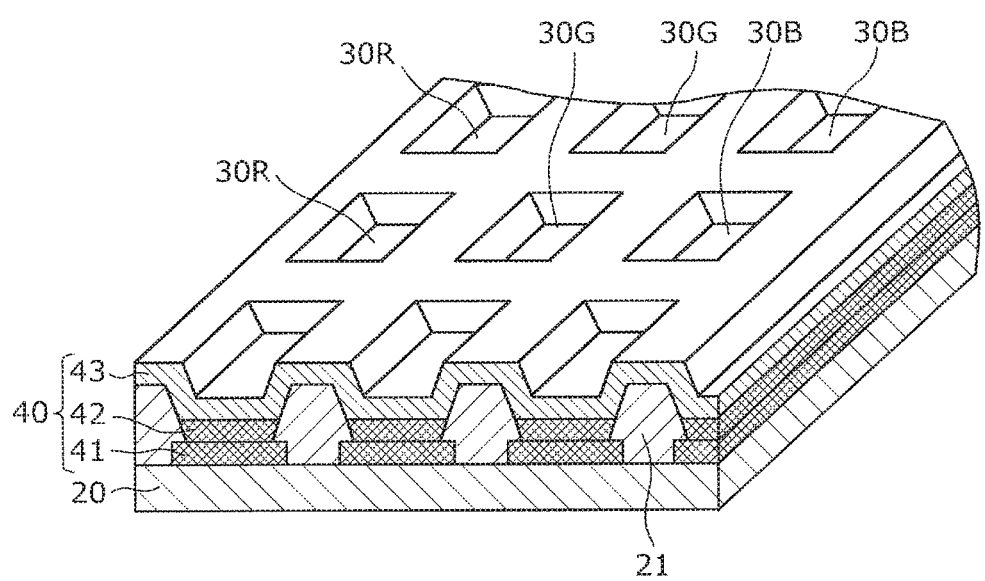
FIG. 2 is a perspective view illustrating an example of a pixel bank of an organic EL display device according to an embodiment.

FIG. 1 is a partially cut-out perspective view of an organic EL display device 10 according to the present embodiment. FIG. 2 is a perspective view illustrating an example of a pixel bank of the organic EL display device 10 according to the present embodiment.

As illustrated in FIG. 1, the organic EL display device 10 includes: a TFT substrate (TFT array substrate) 20 including a plurality of thin-film transistors (TFTs); and an organic EL element 40 formed above the TFT substrate 20. The organic EL element 40 includes an anode 41 which is a lower electrode, an EL layer 42 which is a light-emitting layer including an organic material, and a cathode 43 which is an upper electrode.

In the present embodiment, the organic EL display device 10 is a top emission organic EL display device, which means that light from the organic EL element 40 is emitted from the side of the organic EL display device 10 opposite the side where the TFT substrate 20 is provided. In this case, the anode 41, which is a lower electrode, is a reflective electrode including metal, for example, whereas the cathode 43, which is an upper electrode, is a transparent electrode including indium tin oxide (ITO), for example. Note that the organic EL display device 10 is not limited to the top emission organic EL display device; it may be, for example, a bottom emission organic EL display device, which means that light from the organic EL element 40 is emitted from the side of the organic EL display device where the TFT substrate 20 is provided.

A plurality of pixels 30 are arranged in a matrix in the TFT substrate 20, and a pixel circuit 31 is included in each pixel 30.

Each of organic EL elements 40 is formed corresponding to a different one of the pixels 30, and control of the light emission of the organic EL element 40 is performed according to the pixel circuit 31 provided in the corresponding pixel 30. The organic EL elements 40 are formed on an interlayer insulating film (planarizing layer) formed to cover the plurality of thin-film transistors.

Moreover, the organic EL elements 40 have a configuration in which the EL layer 42 is disposed between the anode 41 and the cathode 43. Furthermore, a hole transport layer is formed stacked between the anode 41 and the EL layer 42, and an electron transport layer is formed stacked between the EL layer 42 and the cathode 43. Note that other organic function layers (a hole injection layer, an electron injection layer, etc.) may be formed between the anode 41 and the cathode 43.

The anode 41 may include, for example, an electrically conductive metal such as molybdenum, aluminum, gold, silver, copper or an alloy thereof; an organic, electrically conductive material such as PEDOT:PSS; zinc oxide; or zinc-added indium oxide. The anode 41 is formed using, for example, a vacuum evaporation method, an electron beam evaporation method, an RF sputtering method, or a printing method.

The EL layer 42 is formed on the anode 41 in openings of a bank 21 on a per pixel 30 basis or on a per line basis. The EL layer 42 may include, for example, Alq3 (tris(8-hydroxyquinoline)aluminum). Moreover, for example, the hole injection layer may include copper phthalocyanine, the hole transport layer may include α-NPD(Bis[N-(1-Naphthyl)-N-Phenyl]benzidine), the electron transport layer may include an oxazole derivative, and the electron injection layer may include Alq3. Note that these materials are merely examples, and the above layers may include other materials.

The cathode 43 may include, for example, ITO, $SnO_2$, $In_2O_3$, ZnO, or a combination thereof.

Each pixel 30 is driven by its corresponding pixel circuit 31. Moreover, in the TFT substrate 20, a plurality of gate lines (scanning lines) 50 are disposed along the row direction of the pixels 30, a plurality of source lines (signal lines) 60 are disposed along the column direction of the pixels 30 to cross with the gate lines 50, and a plurality of power supply lines (not illustrated) are disposed parallel to the source lines 60. The pixels 30 are partitioned from one another by the crossing gate lines 50 and source lines 60, for example.

The gate lines 50 are connected, on a per-row basis, to the gate electrode of a thin-film transistor operating as a switching element included in each pixel circuit 31. The source lines 60 are connected, on a per-column basis, to the source electrode of the thin-film transistor operating as the switching element included in each pixel circuit 31. The power supply lines are connected, on a per-column basis, to the drain electrode of a thin-film transistor operating as a driver element included in each pixel circuit 31.

As illustrated in FIG. 2, each pixel 30 of the organic EL display device 10 includes subpixels 30R, 30G, and 30B corresponding to three colors (red, green, and blue). The subpixels 30R, 30G, and 30B are each formed in plurality, and are arranged in a matrix on a display surface. The subpixels 30R, 30G, and 30B are partitioned from one another by the bank 21.

The bank 21 is formed in a lattice pattern such that ridges extending parallel to the gate lines 50 and ridges extending parallel to the source lines 60 cross one another. The regions surrounded by these ridges (that is, the openings of the bank 21) correspond one-on-one to the subpixels 30R, 30G, and 30B. Note that although the bank 21 is a pixel bank in the present embodiment, the bank 21 may be line banks.

The anode 41 is formed in the openings of the bank 21, on the interlayer insulating film (planarizing layer) on the TFT substrate 20, for each subpixel 30R, 30G, and 30B. Similarly, the EL layer 42 is formed in the openings of the bank 21, on the anode 41, for each subpixel 30R, 30G, and 30B. The transparent cathode 43 is continuously formed over the bank 21, to cover all the EL layers 42 (all the subpixels 30R, 30G, and 30B).

Further, the pixel circuit 31 is provided for each subpixel 30R, 30G, and 30B, and each subpixel 30R, 30G, and 30B is electrically connected with its corresponding pixel circuit 31 via a contact hole and a relay electrode. Note that the subpixels 30R, 30G, and 30B have the same configuration except that the color of light emitted by the EL layer 42 is different.

Figure 3:
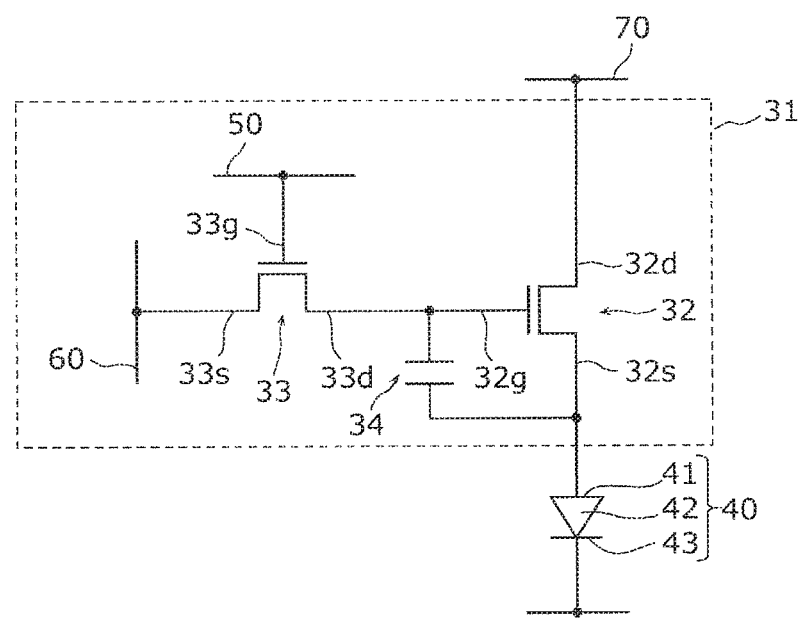
FIG. 3 is a circuit diagram illustrating a configuration of a pixel circuit of each pixel in an organic EL display device according to an embodiment.

Here, a circuit configuration of the pixel circuit 31 in each pixel 30 will be described with reference to FIG. 3. FIG. 3 is a circuit diagram illustrating a configuration of a pixel circuit 31 in the organic EL display device 10 according to the present embodiment.

As illustrated in FIG. 3, the pixel circuit 31 includes a thin-film transistor 32 that operates as a driver element, a thin-film transistor 33 that operates as a switching element, and a capacitor 34 that stores data to be displayed by the corresponding pixel 30. In the present embodiment, the thin-film transistor 32 is a driver transistor for driving the organic EL element 40, and the thin-film transistor 33 is a switching transistor for selecting a pixel 30.

The thin-film transistor 32 includes: a gate electrode 32g connected to a drain electrode 33d of the thin-film transistor 33 and one end of the capacitor 34; a drain electrode 32d connected to a power supply line 70; a source electrode 32s connected to the other end of the capacitor 34 and the anode 41 of the organic EL element 40; and a semiconductor film (not illustrated). The thin-film transistor 32 supplies current corresponding to data voltage held in the capacitor 34 from the power supply line 70 to the anode 41 of the organic EL element 40 via the source electrode 32s. With this, in the organic EL elements 40, drive current flows from the anode 41 to the cathode 43 whereby the EL layer 42 emits light.

The thin-film transistor 33 includes: a gate electrode 33g connected to the gate line 50; a source electrode 33s connected to the source line 60; a drain electrode 33d connected to one end of the capacitor 34 and the gate electrode 32g of the thin-film transistor 32; and a semiconductor film (not illustrated). When a predetermined voltage is applied to the gate line 50 and the source line 60 connected to the thin-film transistor 33, current flows between the source electrode and the drain electrode. With this, the voltage applied to the source line 60 is stored in the capacitor 34 as data voltage.

Note that the organic EL display device 10 having the above-described configuration adopts the active matrix system in which display control is performed for each pixel 30 located at the cross-point between a gate line 50 and a source line 60. With this, the thin-film transistors 32 and 33 of each pixel 30 (each subpixel) cause the corresponding organic EL element 40 to selectively emit light, whereby a desired image is displayed.

Note that in FIG. 3, the two thin-film transistors 32 and 33 and the one capacitor 34 are provided as the pixel circuit 31—that is to say, the pixel circuit 31 is exemplified as what is known as a 2Tr1C—but the pixel circuit 31 is not limited to this example. For example, the pixel circuit 31 may further include, for example, a transistor for correcting the threshold voltage of the driver transistor.

[2. Thin-Film Transistor (TFT) Substrate]

Figure 4:
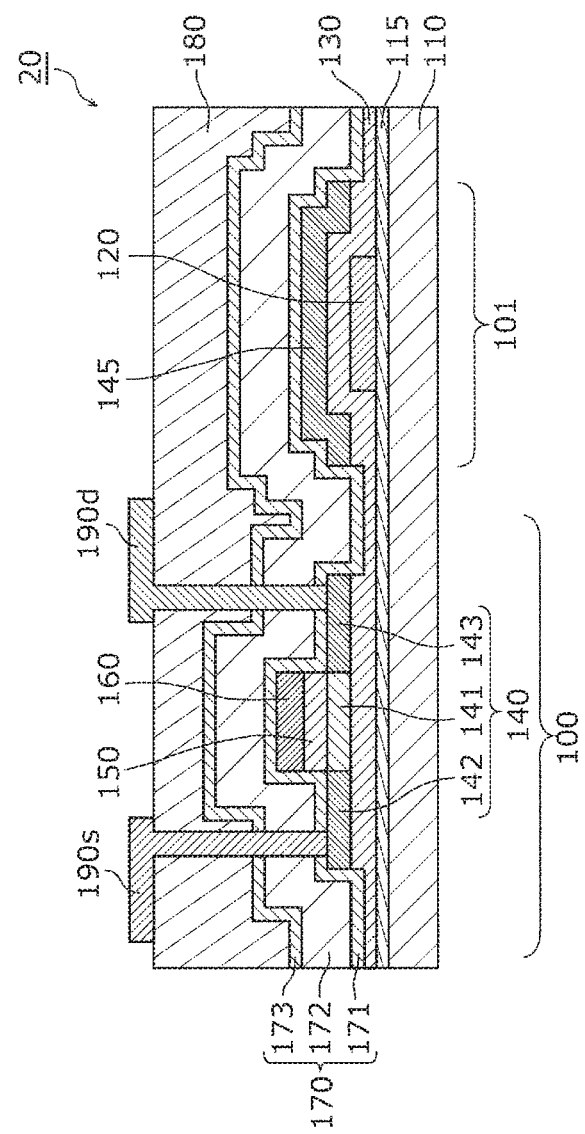
FIG. 4 is a cross sectional view illustrating a configuration of a TFT substrate according to an embodiment.

Next, the TFT substrate 20 according to the present embodiment will be described with reference to FIG. 4. FIG. 4 is a cross sectional view illustrating a configuration of the TFT substrate 20 according to the present embodiment.

As illustrated in FIG. 4, the TFT substrate 20 includes a TFT 100 and a capacitor 101. The TFT 100 is a top-gate oxide semiconductor TFT including an oxide semiconductor layer as a channel layer. The TFT 100 is, for example, the thin-film transistor 32 illustrated in FIG. 3, and can be used as a driver transistor. Alternatively, the TFT 100 may be the thin-film transistor 33 illustrated in FIG. 3, and may be used as a switching transistor.

The TFT substrate 20 includes a substrate 110, an undercoat layer 115, a lower electrode layer 120, a capacitor insulating layer 130, an oxide semiconductor layer 140, an upper electrode layer 145, a gate insulating layer 150, a gate electrode layer 160, an interlayer insulating layer 170, a planarizing layer 180, a source electrode layer 190s, and a drain electrode layer 190d.

The TFT 100 includes the oxide semiconductor layer 140, the gate insulating layer 150, the gate electrode layer 160, the source electrode layer 190s, and the drain electrode layer 190d. The gate electrode layer 160, the source electrode layer 190s, and the drain electrode layer 190d correspond to the gate electrode 32g, the source electrode 32s, and the drain electrode 32d, respectively, illustrated in FIG. 3.

The capacitor 101 includes the lower electrode layer 120, the capacitor insulating layer 130, and the upper electrode layer 145. The capacitor 101 corresponds to the capacitor 34 illustrated in FIG. 3, for example. The capacitor 101 is electrically connected to the TFT 100.

Note that in the following description, "above" relative to the substrate 110 refers to the side of the substrate 110 where the undercoat layer 115 is provided and, more specifically, means the upward direction in which the layers are stacked. Moreover, "below" relative to the substrate 110 refers to the side of the substrate 110 opposite the side where the undercoat layer 115 is provided and, more specifically, means the downward direction opposite the direction in which the layers are stacked.

Hereinafter, with reference to FIG. 4, the structural elements of the TFT substrate 20 according to the present embodiment will be described in detail.

[2-1. Substrate]

The substrate 110 is, for example, a substrate including an electrically insulating material. For example, the substrate 110 may include glass such as an alkali-free glass, quartz glass, or high-heat resistant glass, or a resin such as polyethylene, polypropylene, or polyimide.

Note that the substrate 110 may be, for example, a flexible substrate having a sheet- or film-like shape. The substrate 110 may be, for example, a flexible resin substrate including a single layer or stacked layers of a film material such as polyimide, polyethylene terephthalate, or polyethylene naphthalate.

Note that when the substrate 110 is a flexible substrate, in the fabrication process of the thin-film transistor 20, a support substrate such as a glass substrate is provided to the back surface of the substrate 110. For example, the TFT substrate 20 can be used in a flexible display by separating the support substrate from the substrate 110 after forming the thin-film transistor 100 and the organic EL elements 40.

[2-2. Undercoat Layer]

The undercoat layer 115 is one example of a non-organic layer disposed on the substrate 110. The undercoat layer 115 is formed on a surface of the substrate 110 (on a surface that is on the same side as the oxide semiconductor layer 140). By forming the undercoat layer 115, impurities (for example, sodium (Na) and phosphorus (P)) in the substrate 110 or moisture in the atmosphere, for example, can be inhibited from infiltrating the oxide semiconductor layer 140. With this, film properties of the oxide semiconductor layer 140 can be stabilized and TFT characteristics can be stabilized.

The undercoat layer 115 may have a single layer structure or a stacked layer structure. For example, the undercoat layer 115 has a stacked layer structure including a silicon nitride film ($SiN_x$) and a silicon oxide film ($SiO_x$). The film thickness of the undercoat layer 115 is, for example, in a range from 100 nm to 1000 nm, inclusive.

[2-3. Lower Electrode Layer]

The lower electrode layer 120 is an example of a first electrode layer disposed above the substrate 110, and is formed in a predetermined shape. In the present embodiment, the lower electrode layer 120 is formed on the undercoat layer 115.

The lower electrode layer 120 is smaller than the upper electrode layer 145. Specifically, as illustrated in FIG. 5, in plan view, the end portion (outer edge) of the lower electrode layer 120 is located within the end portion (outer edge) of the upper electrode layer 145.

Figure 5:
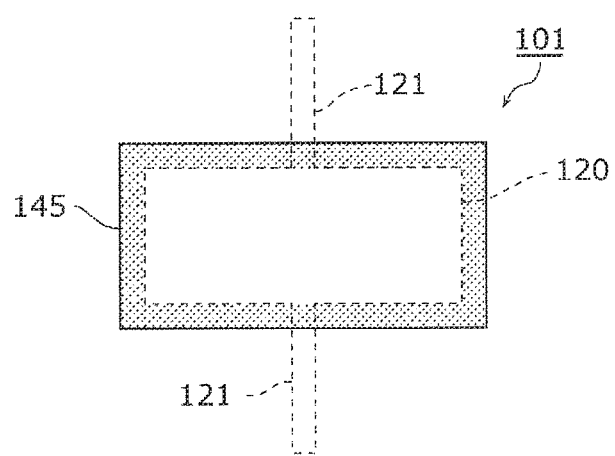
FIG. 5 is a plan view schematically illustrating the electrode shape of a capacitor of a TFT substrate according to an embodiment.

FIG. 5 is a plan view schematically illustrating the electrode shape of the capacitor 101 of the TFT substrate 20 according to the present embodiment. In FIG. 5, the dashed line shows the plan view shape (outline) of the lower electrode layer 120, and the solid line shows the plan view shape (outline) of the upper electrode layer 145.

As illustrated in FIG. 5, an extension 121 extending outward from at least a portion of the outer edge of the lower electrode layer 120 in plan view is provided to the lower electrode layer 120. In the present embodiment, two extensions 121 are provided.

Each of the extensions 121 is a line for electrically connecting the lower electrode layer 120 and, for example, an electrode of the TFT 100. Each extension 121 electrically connects, for example, the lower electrode layer 120 with the gate electrode layer 160, the source electrode layer 190s, or the drain electrode layer 190d.

The lower electrode layer 120 includes an electrically conductive material as a main component. Specifically, the electrically conductive material is, for example, titanium (Ti) or aluminum (Al), but is not limited to these. For example, the electrically conductive material includes metal such as molybdenum (Mo), copper (Cu), tungsten (W), manganese (Mn), chrome (Cr), tantalum (Ta), niobium (Nb), silver (Ag), gold (Au), platinum (Pt), palladium (Pd), indium (In), nickel (Ni), or neodymium (Nd), or an alloy of two or more metals selected from these (for example, molybdenum-tungsten (MoW)). In the present embodiment, the lower electrode layer 120 has a single layer structure including titanium.

[2-4. Capacitor Insulating Layer]

The capacitor insulating layer 130 is formed above the substrate 110. In the present embodiment, the capacitor insulating layer 130 is formed on the undercoat layer 115 to cover the lower electrode layer 120. Specifically, the capacitor insulating layer 130 is formed over the entire surface of the undercoat layer 115.

The capacitor insulating layer 130 is formed using an electrically insulating material. The capacitor insulating layer 130 is, for example, an insulating film having a single layer of silicon oxide ($SiO_x$), silicon nitride ($SiN_x$), silicon oxynitride ($SiON_x$), aluminum oxide ($AlO_x$), tantalum oxide ($TaO_x$), or hafnium oxide ($HfO_x$), or an insulating film having stacked layers of these materials.

The capacitor insulating layer 130 is disposed between the lower electrode layer 120 and the upper electrode layer 145. That is to say, the capacitor insulating layer 130 is a dielectric (dielectric film) between the lower electrode layer 120 and the upper electrode layer 145 of the capacitor 101. Thus, the material of the capacitor insulating layer 130 is selected as appropriate according to the capacity of the capacitor 101 required. In the present embodiment, the capacitor insulating layer 130 is formed using the same material as that of the gate insulating layer 150. Specifically, the capacitor insulating layer 130 is formed using silicon oxide.

[2-5. Oxide Semiconductor Layer]

The oxide semiconductor layer 140 is a channel layer of the TFT 100. The oxide semiconductor layer 140 is opposed to the gate electrode layer 160 with the gate insulating layer 150 between the oxide semiconductor layer 140 and the gate electrode layer 160. In the present embodiment, the oxide semiconductor layer 140 is formed in a predetermined shape on the capacitor insulating layer 130.

As illustrated in FIG. 4, the oxide semiconductor layer 140 includes a channel region 141, a source region 142, and a drain region 143. The channel region 141 is a region opposed to the gate electrode layer 160 with the gate insulating layer 150 between the channel region 141 and the gate electrode layer 160. The source region 142 and the drain region 143 are low-resistance regions having a resistivity lower than that of the channel region 141. The source region 142 and the drain region 143 are formed by, for example, generating oxygen deficiencies in predetermined regions of the film-formed oxide semiconductor. An example of a method for generating oxygen deficiencies is a plasma process using, for instance, argon (Ar) or hydrogen (H) gas.

The oxide semiconductor layer 140 includes a transparent amorphous oxide semiconductor (TAOS) as a main component. Specifically, the oxide semiconductor layer 140 includes a metal oxide as a main component. The metal is, for example, indium (In), gallium (Ga), or zinc (Zn). The oxide semiconductor layer 140 may include, for example, InGaZnO, InTiZnO, ZnO, InGaO, and InZnO. When, for example, the oxide semiconductor layer 140 includes InGaZnO, the compositional ratio of each element is, for example, $InGaZnO_x$. The film thickness of the oxide semiconductor layer 140 is, for example, in a range from 10 nm to 300 nm, inclusive.

[2-6. Upper Electrode Layer]

The upper electrode layer 145 is an example of a second electrode layer disposed above and opposed to the lower electrode layer 120, and is formed in a predetermined shape. In the present embodiment, the upper electrode layer 145 is formed on the capacitor insulating layer 130.

The upper electrode layer 145 includes, as a main component, an oxide semiconductor material to which electrical conductivity is given. In the present embodiment, the upper electrode layer 145 is formed in the same layer as the oxide semiconductor layer 140, and is formed using the same material as that of the oxide semiconductor layer 140. The film thickness of the upper electrode layer 145 is the same as that of the oxide semiconductor layer 140, and is in a range from 10 nm to 300 nm, inclusive, for example.

The upper electrode layer 145 is formed by giving electrical conductivity to the film-formed transparent amorphous oxide semiconductor (by causing the film-formed transparent amorphous oxide semiconductor to carry electricity). The giving of electrical conductivity (that is, decreasing the resistance) is performed by generating oxygen deficiencies in the oxide semiconductor, in a similar manner to the formation of the source region 142 and the drain region 143.

In plan view, the upper electrode layer 145 covers the lower electrode layer 120 except the extensions 121. To put it in simple terms, the upper electrode layer 145 is larger than the lower electrode layer 120. Specifically, as illustrated in FIG. 5, the end portion (outer edge) of the upper electrode layer 145 is located outside the end portion (outer edge) of the lower electrode layer 120.

That is to say, the plan view shape of the upper electrode layer 145 is equivalent to a sum of the plan view shape of the lower electrode layer 120 and the plan view shape of an additional region adjacent to the plan view shape of the lower electrode layer 120 and having a predetermined width. As illustrated in FIG. 5, the plan view shape of the lower electrode layer 120 excluding the extensions 121 is a rectangle. The plan view shape of the upper electrode layer 145 is equivalent to a sum of the rectangle and an additional region provided all around the rectangle and having a predetermined width.

In FIG. 5, the shape of the additional region is shown by dotted shading. As illustrated in FIG. 5, the additional region is formed in a rectangular frame shape having a uniform width, for example. The width is at least 1 μm, for example, but is not limited to this.

Note that, although not illustrated in FIG. 5, the upper electrode layer 145 may have an extension too. The extension of the upper electrode layer 145 electrically connects, for example, the upper electrode layer 145 with the gate electrode layer 160, the source electrode layer 190s, or the drain electrode layer 190d of the TFT 100.

[2-7. Gate Insulating Layer]

The gate insulating layer 150 is disposed on the channel region 141 of the oxide semiconductor layer 140. While the details will be described later, the gate insulating layer 150 is formed in a self-aligned fashion using the gate electrode layer 160 as a mask. Accordingly, the plan view shape of the gate insulating layer 150 and the plan view shape of the gate electrode layer 160 approximately match each other.

In the present embodiment, the side surfaces of the gate insulating layer 150 are approximately flush with the side surfaces of the channel region 141, and in a top view, the outline of the gate insulating layer 150 and the outline of the channel region 141 are approximately aligned.

The gate insulating layer 150 is a single-layer insulating layer or an insulating layer of stacked layers including an oxide insulating layer or a nitride insulating layer. A single layer film of silicon oxide ($SiO_x$), silicon nitride ($SiN_x$), silicon oxynitride ($SiON_x$), aluminum oxide ($AlO_x$), or tantalum oxide ($TaO_x$) can be used as the gate insulating layer 150, or a film having stacked layers of these can be used as the gate insulating layer 150. The film thickness of the gate insulating layer 150 can be set based on, for example, the breakdown voltage of the TFT 100, and is, for example, in a range from 50 nm to 400 nm, inclusive.

[2-8. Gate Electrode Layer]

The gate electrode layer 160 is disposed on the gate insulating layer 150. Specifically, the gate electrode layer 160 is located in a direction directly above the channel region 141. In the present embodiment, the side surfaces of the gate electrode layer 160 are approximately flush with the side surfaces of the gate insulating layer 150, and in a top view, the outline of the gate electrode layer 160 and the outline of the gate insulating layer 150 are approximately aligned.

The gate electrode layer 160 is an electrode having a single layer structure or a stacked layer structure including an electrically conductive material such as metal or an alloy thereof. The gate electrode layer 160 may include, for example, aluminum (Al), molybdenum (Mo), tungsten (W), molybdenum-tungsten (MoW), copper (Cu), titanium (Ti), and chromium (Cr). The film thickness of the gate electrode layer 160 is, for example, in a range from 50 nm to 300 nm, inclusive.

[2-9. Interlayer Insulating Layer]

The interlayer insulating layer 170 is an insulating layer disposed for inhibiting transmission of hydrogen. As illustrated in FIG. 4, the interlayer insulating layer 170 is a film having a three-layered structure formed by stacking a lower aluminum oxide layer 171, an intermediate insulating layer 172, and an upper aluminum oxide layer 173. By disposing an aluminum oxide layer in the upper layer portion and the lower layer portion of the interlayer insulating layer 170, it is possible to enhance the hydrogen block function.

[2-9-1. Lower Aluminum Oxide Layer]

The lower aluminum oxide layer 171 is an example of a hydrogen inhibiting layer (hydrogen block layer) that inhibits transmission of hydrogen. The lower aluminum oxide layer 171 inhibits hydrogen contained in the intermediate insulating layer 172 from being supplied to the channel region 141. The lower aluminum oxide layer 171 also inhibits hydrogen contained in the undercoat layer 115 or the capacitor insulating layer 130 from being supplied to the intermediate insulating layer 172.

The lower aluminum oxide layer 171 is disposed to cover the surfaces of the gate electrode layer 160, the source region 142, the drain region 143, the upper electrode layer 145, and the capacitor insulating layer 130. Specifically, the lower aluminum oxide layer 171 is disposed on and in contact with each of the source region 142, the drain region 143, and the upper electrode layer 145.

More specifically, the lower aluminum oxide layer 171 covers the top and side surfaces of the gate electrode layer 160, the side surfaces of the gate insulating layer 150, the top and side surfaces of the source region 142, the top and side surfaces of the drain region 143, the top and side surfaces of the upper electrode layer 145, and the top surface of the capacitor insulating layer 130. Note that the lower aluminum oxide layer 171 need not be disposed on the gate electrode layer 160.

The lower aluminum oxide layer 171 also has a function to promote low-resistance of the source region 142, the drain region 143, and the upper electrode layer 145. Specifically, the lower aluminum oxide layer 171 removes oxygen from the source region 142, the drain region 143, and the upper electrode layer 145 to generate oxygen deficiencies. With this, the resistance of the source region 142, the drain region 143, and the upper electrode layer 145 decreases (that is, electrical conductivity is given to the source region 142, the drain region 143, and the upper electrode layer 145).

The source region 142 and the drain region 143 are regions electrically connected to the source electrode layer 190s and the drain electrode layer 190d, respectively. Thus, the source region 142 and the drain region 143 preferably have low contact resistance. Since the lower aluminum oxide layer 171 reduces the resistance of the source region 142 and the drain region 143, the contact resistance decreases, thereby enhancing TFT characteristics.

The lower aluminum oxide layer 171 is of a film thickness sufficient to remove oxygen from the oxide semiconductor layer 140 and the upper electrode layer 145, for example, 10 nm or higher, and preferably 20 nm or higher. Moreover, the film density of the lower aluminum oxide layer 171 is 2.7 g/cm$^3$ or less, for example.

[2-9-2. Intermediate Insulating Layer]

The intermediate insulating layer 172 is disposed to cover the lower aluminum oxide layer 171. Specifically, the intermediate insulating layer 172 is formed to cover the entire surface of the element region where the TFT 100 and the capacitor 101 are formed. The film thickness of the intermediate insulating layer 172 is, but not particularly limited to, 200 nm, for example.

The intermediate insulating layer 172 includes a material having a non-organic substance as a main component. For example, a single layer film of silicon oxide ($SiO_x$), silicon nitride ($SiN_x$), silicon oxynitride ($SiON_x$), or aluminum oxide ($AlO_x$) can be used as the intermediate insulating layer 172, or a film having stacked layers of these can be used as the intermediate insulating layer 172. Here, the intermediate insulating layer 172 may be formed as a thick film using a material having a low relative permittivity. With this, the parasitic capacitance between the gate electrode layer 160 and the source electrode layer 190s or the drain electrode layer 190d can be reduced.

[2-9-3. Upper Aluminum Oxide Layer]

The upper aluminum oxide layer 173 is an example of a hydrogen inhibiting layer (hydrogen block layer) that inhibits transmission of hydrogen. The upper aluminum oxide layer 173 inhibits hydrogen contained in the planarizing layer 180 from being supplied to the intermediate insulating layer 172.

The upper aluminum oxide layer 173 is disposed to cover the intermediate insulating layer 172. Specifically, the upper aluminum oxide layer 173 is formed to cover the entire surface of the element region where the TFT 100 and the capacitor 101 are formed. The film thickness of the upper aluminum oxide layer 173 is, but not particularly limited to, 10 nm or higher, for example.

[2-10. Planarizing Layer]

The planarizing layer 180 is formed on the interlayer insulating layer 170. The planarizing layer 180 is formed using, for example, an organic material such as polyimide. Note that the planarizing layer 180 is not limited to an organic material, and may be formed using a non-organic material such as silicon oxide ($SiO_x$), silicon nitride ($SiN_x$), silicon oxynitride ($SiON_x$), or aluminum oxide ($AlO_x$). The planarizing layer 180 may be a single layer film or a film having stacked layers.

A plurality of openings (contact holes) are formed in the planarizing layer 180 and the interlayer insulating layer 170 such that the openings pass through the planarizing layer 180 and the interlayer insulating layer 170 continuously. Via these openings, the source electrode layer 190s and the source region 142 are connected, and the drain electrode layer 190d and the drain region 143 are connected.

[2-11. Source Electrode Layer and Drain Electrode Layer]

The source electrode layer 190s and the drain electrode layer 190d are formed in a predetermined shape on the planarizing layer 180. The source electrode layer 190s and the drain electrode layer 190d are electrically connected to the oxide semiconductor layer 140.

In the present embodiment, the source electrode layer 190s is electrically and physically connected to the source region 142 via an opening (contact hole) formed in the planarizing layer 180 and the interlayer insulating layer 170. Moreover, the drain electrode layer 190d is electrically and physically connected to the drain region 143 via an opening formed in the planarizing layer 180 and the interlayer insulating layer 170.

The source electrode layer 190s and the drain electrode layer 190d are electrodes having a single layer structure or a stacked layer structure including an electrically conductive material or an alloy thereof. The source electrode layer 190s and the drain electrode layer 190d may include, for example, aluminum (Al), molybdenum (Mo), tungsten (W), molybdenum-tungsten (MoW), copper (Cu), titanium (Ti), and chromium (Cr). The film thickness of the source electrode layer 190s and the drain electrode layer 190d is, for example, in a range from 50 nm to 300 nm, inclusive.

[3. Fabrication Method of TFT Substrate]

Next, a method of fabricating the TFT substrate 20 according to the present embodiment will be described with reference to FIG. 6A to FIG. 6D.

Figure 6A:
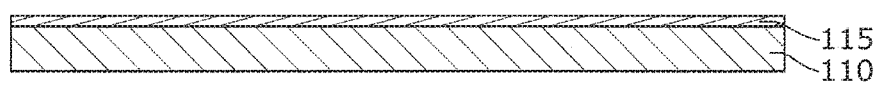
FIG. 6A is a cross sectional view illustrating processes from preparation of a substrate to formation of an oxide semiconductor layer, in a method of fabricating a TFT substrate according to an embodiment.
Figure 6A:
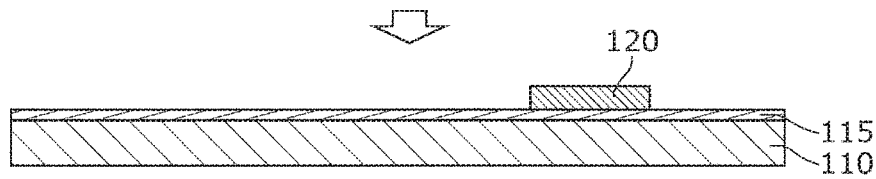
Figure 6A:
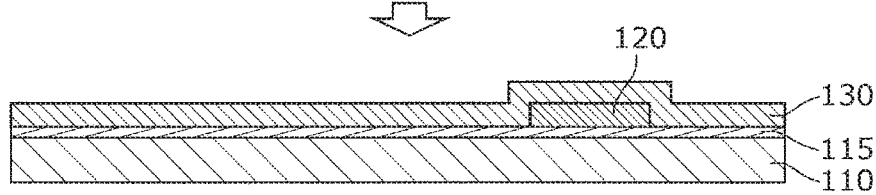
Figure 6A:
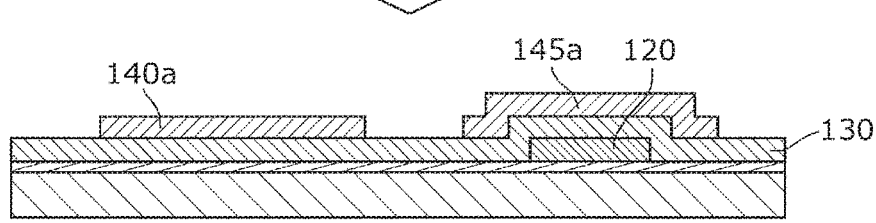
Figure 6B:
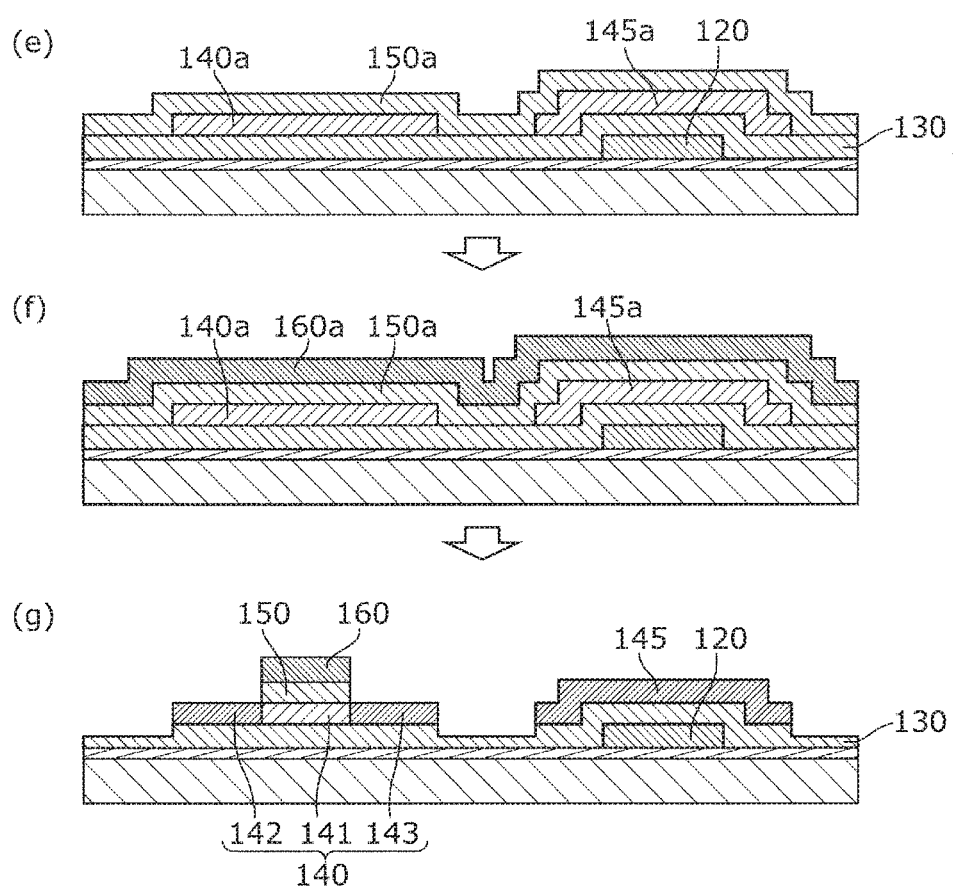
FIG. 6B is a cross sectional view illustrating processes from formation of a gate insulating film to patterning of a gate electrode film and a gate insulating film, in a method of fabricating a TFT substrate according to an embodiment.
Figure 6C:
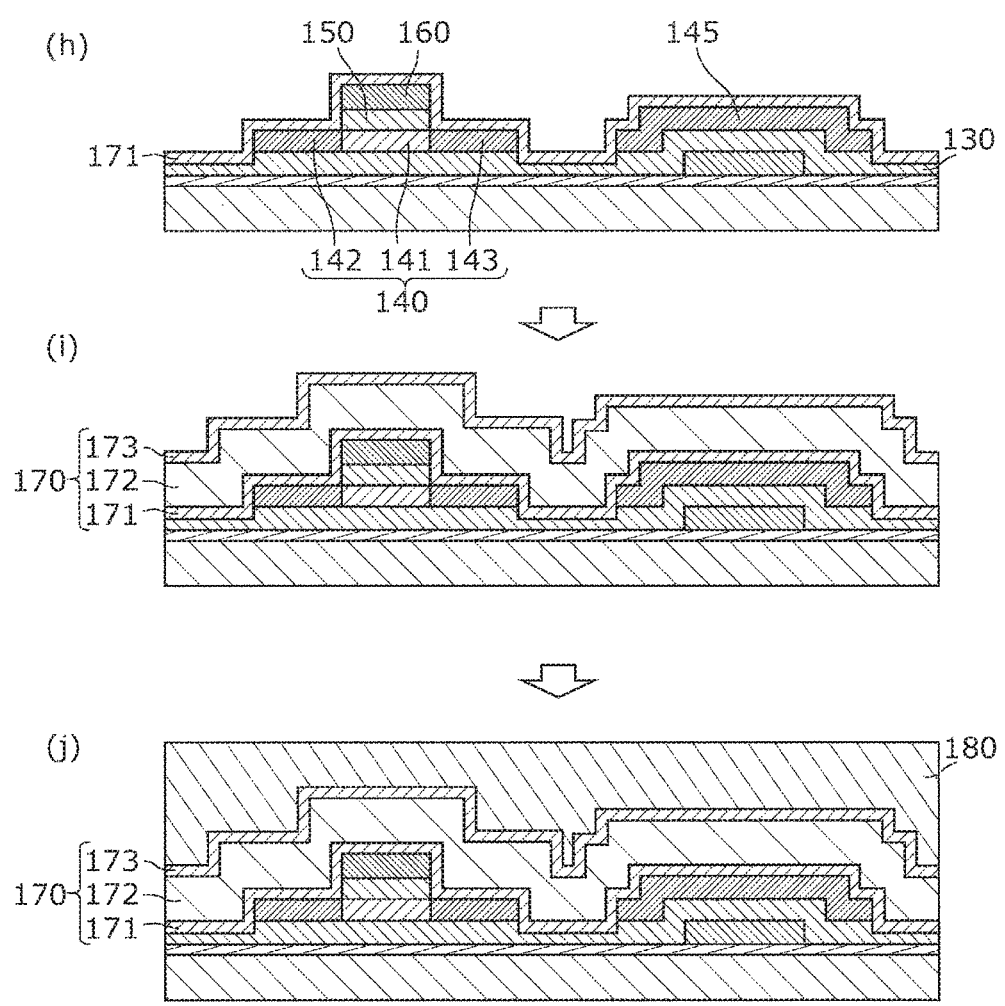
FIG. 6C is a cross sectional view illustrating processes from formation of a lower aluminum oxide layer to formation of a planarizing layer, in a method of fabricating a TFT substrate according to an embodiment.
Figure 6D:
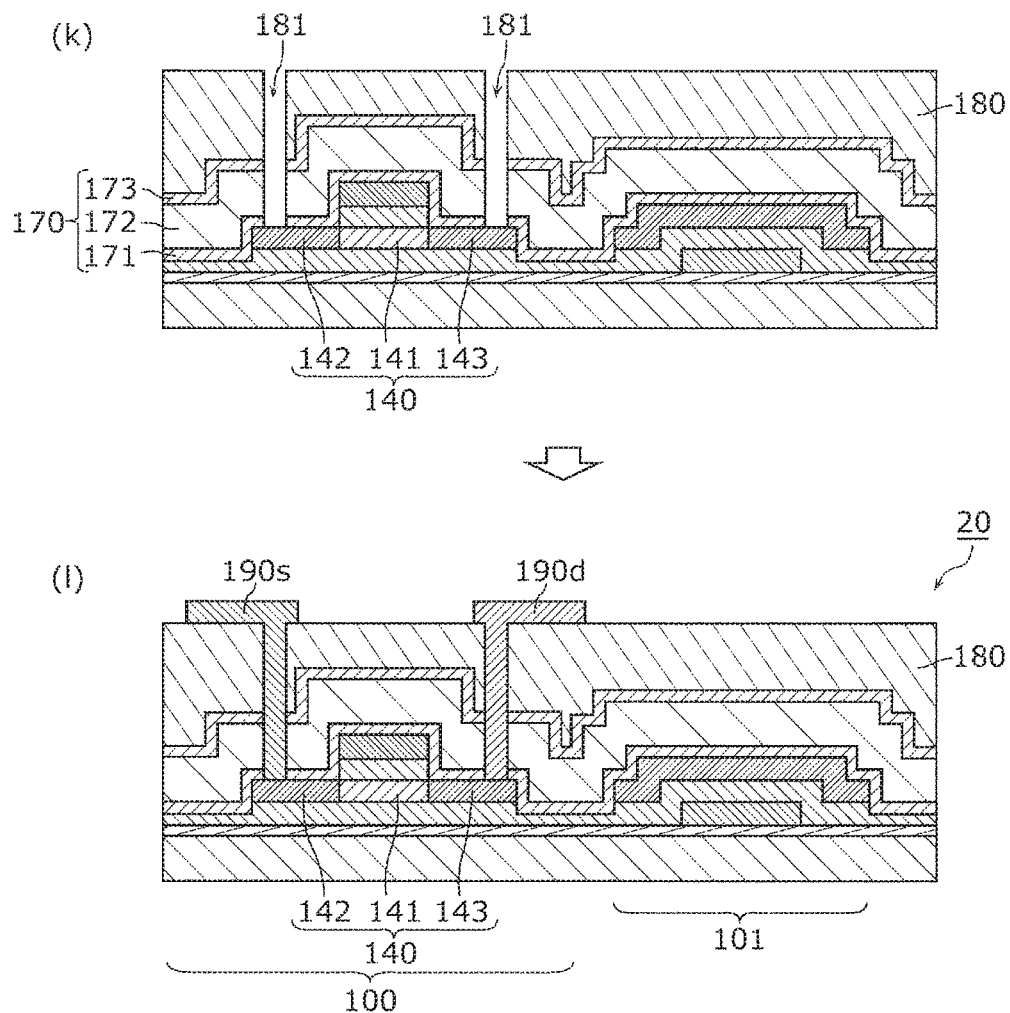
FIG. 6D is a cross sectional view illustrating processes from formation of openings (contact holes) to formation of a source electrode and a drain electrode, in a method of fabricating a TFT substrate according to an embodiment.

FIG. 6A to FIG. 6D are cross sectional views illustrating the method of fabricating the TFT substrate 20 according to the present embodiment. Specifically, FIG. 6A illustrates processes from preparation of the substrate 110 to formation of the oxide semiconductor layer 140. FIG. 6B illustrates processes from formation of a gate insulating film 150a to patterning of a gate electrode film 160a and the gate insulating film 150a. FIG. 6C illustrates processes from formation of the lower aluminum oxide layer 171 to formation of the planarizing layer 180. FIG. 6D illustrates processes from formation of openings (contact holes) 181 to formation of the source electrode layer 190s and the drain electrode layer 190d.

First, as illustrated in (a) in FIG. 6A, the substrate 110 is prepared, and the undercoat layer 115 is formed above the substrate 110. For example, first, a glass substrate is prepared as the substrate 110. Next, for example, a film having stacked layers of a silicon nitride film and a silicon oxide film is formed as the undercoat layer 115 using, for example, a plasma chemical vapor deposition (CVD) method, a sputtering method, or an atomic layer deposition (ALD) method.

In the present embodiment, the silicon nitride film and the silicon oxide film are formed using the plasma CVD method. Specifically, the silicon nitride film can be formed by introducing a silane gas ($SiH_4$), an ammonia gas ($NH_3$), and a nitrogen gas ($N_2$) into a vacuum chamber and generating plasma. Moreover, the silicon oxide film can be formed by introducing a silane gas ($SiH_4$) and a nitrous oxide gas ($N_2O$) into a vacuum chamber and generating plasma.

Next, as illustrated in (b) in FIG. 6A, the lower electrode layer 120 of the capacitor 101 is formed above the substrate 110. In the present embodiment, the lower electrode layer 120 is formed on the undercoat layer 115. The lower electrode layer 120 patterned in a predetermined shape can be formed by, for example, forming a metal film (a titanium film, for example) on the undercoat layer 115 using a sputtering method, and processing the metal film using a photolithography method and a wet etching method.

Next, as illustrated in (c) in FIG. 6A, the capacitor insulating layer 130 is formed above the lower electrode layer 120. In the present embodiment, the capacitor insulating layer 130 is formed over the entire surface of the undercoat layer 115 to cover the lower electrode layer 120. The capacitor insulating layer 130 is a silicon oxide film, for example. Similar to the undercoat layer 115, the silicon oxide film is formed using a plasma CVD method.

Next, as illustrated in (d) in FIG. 6A, an oxide semiconductor layer 140a which is not located in a direction directly above the lower electrode layer 120, and an oxide semiconductor layer 145a which is located in a direction directly above the lower electrode layer 120 are formed. The oxide semiconductor layer 140a corresponds to the oxide semiconductor layer 140 (channel layer) of the TFT 100, whereas the oxide semiconductor layer 145a corresponds to the upper electrode layer 145 of the capacitor 101. Each of the oxide semiconductor layers 140a and 145a is formed at a predetermined position in a predetermined shape.

Specifically, first, an oxide semiconductor film is formed over the entire surface of the capacitor insulating layer 130. The oxide semiconductor film may include a transparent amorphous oxide semiconductor such as InGaZnO. In this case, an oxide semiconductor film including InGaZnO is formed using a sputtering method or a vapor deposition method such as a laser evaporation method. For example, a target material including In, Ga, and Zn (for example, a polycrystalline sintered body having an $InGaO_3(ZnO)_4$ composition) is used, an argon (Ar) gas as an inert gas and a gas including oxygen ($O_2$) as a reactive gas are introduced into a vacuum chamber, and electricity of a predetermined power density is applied to the target material.

After forming the oxide semiconductor film, the oxide semiconductor film is patterned using a photolithography method and a wet etching method, thereby forming the oxide semiconductor layers 140a and 145a. Note that for the wet etching of the InGaZnO, a mixed chemical solution of, for example, phosphoric acid ($H_3PO_4$), nitric acid ($HNO_3$), acetic acid ($CH_3COOH$), and water ($H_2O$) can be used.

Next, as illustrated in (e) in FIG. 6B, a gate insulating film 150a is formed on the oxide semiconductor layers 140a and 145a. In the present embodiment, the gate insulating film 150a is formed over the entire surface of the capacitor insulating layer 130 to cover the oxide semiconductor layers 140a and 145a. The gate insulating film 150a is a silicon oxide film, for example. Similar to the undercoat layer 115, the silicon oxide film is formed using a plasma CVD method.

Next, as illustrated in (f) in FIG. 6B, a gate electrode film 160a is formed on the gate insulating film 150a. The gate electrode film 160a is a film having stacked layers of Ti/Al/Ti, for example. For example, the film having stacked layers of Ti/Al/Ti is formed by forming Ti, Al, and Ti in sequence using, for example, a sputtering method.

Next, as illustrated in (g) in FIG. 6B, the gate electrode layer 160 and the gate insulating layer 150 are formed by processing the gate electrode film 160a and the gate insulating film 150a. By doing so, portions of the oxide semiconductor layer 140a (specifically, a portion that functions as the source region 142 and a portion that functions as the drain region 143) and the entirety of the oxide semiconductor layer 145a (specifically, the upper electrode layer 145) are exposed.

Specifically, first, by patterning the gate electrode film 160a using a photolithography method and an etching method, the gate electrode layer 160 having a predetermined shape is formed on the gate insulating film 150a. For the etching of the gate electrode film 160a, which is a film having stacked layers of Ti/Al/Ti, dry etching such as reactive ion etching (RIE) using a gas such as sulfur hexafluoride ($SF_6$), oxygen ($O_2$), or boron trichloride ($BCl_3$) can be performed.

Then, the gate insulating layer 150 having approximately the same plan view shape as the gate electrode layer 160 is formed in a self-aligned fashion by patterning the gate insulating film 150a using the gate electrode layer 160 as a mask. For example, for the etching of the gate insulating film 150a that is a silicon oxide film, dry etching using a gas such as carbon tetrafluoride ($CF_4$) and oxygen gas ($O_2$) can be performed. In the present embodiment, for example, processing of the gate electrode film 160a and processing of the gate insulating film 150a can be continuously performed in this order by dry etching.

At this time, the resistance of the exposed portions of the oxide semiconductor layer 140a (the source region 142 and the drain region 143) and the resistance of the oxide semiconductor layer 145a decrease due to plasma in the dry etching. Specifically, a portion of the oxide semiconductor layers 140a and 145a which is exposed to plasma generates oxygen deficiencies, and the resistance of that portion decreases. With this, the source region 142 and the drain region 143 having favorable contact performance as a result of the decrease in resistance are formed, and the upper electrode layer 145 having electrical conductivity is formed.

At this time, due to overetching, a portion of the capacitor insulating layer 130 is also removed with the oxide semiconductor layer 140 and the upper electrode layer 145 serving as masks. With this, as illustrated in (g) in FIG. 6B, the capacitor insulating layer 130 is partially etched and becomes thinner, thereby forming steps in the capacitor insulating layer 130.

Next, as illustrated in (h) in FIG. 6C, the lower aluminum oxide layer 171 is formed to cover the source region 142, the drain region 143, the gate electrode layer 160, and the upper electrode layer 145. In the present embodiment, the lower aluminum oxide layer 171 is formed over the entire surface to cover the source region 142, the drain region 143, the gate electrode layer 160, the upper electrode layer 145, and the capacitor insulating layer 130. The lower aluminum oxide layer 171 is formed by forming an aluminum oxide film using a reactive sputtering method, for example.

Note that the lower aluminum oxide layer 171 is in contact with the surfaces of the source region 142, the drain region 143, and the upper electrode layer 145, and can remove oxygen from the contact regions. This makes it possible to promote low-resistance of the source region 142, the drain region 143, and the upper electrode layer 145.

Next, as illustrated in (i) in FIG. 6C, the intermediate insulating layer 172 and the upper aluminum oxide layer 173 are formed in sequence, to cover the lower aluminum oxide layer 171. For example, a silicon oxide film is formed as the intermediate insulating layer 172 using a plasma CVD method, and then, an aluminum oxide film is formed as the upper aluminum oxide layer 173 using a reactive sputtering method. With this, the interlayer insulating layer 170 is formed.

Next, the planarizing layer 180 is formed as illustrated in (j) in FIG. 6C. For example, the planarizing layer 180 is formed by applying an organic material over the entire surface. For example, a photosensitive resin including, for example, a polyimide material is applied to the interlayer insulating layer 170. After the application, heat treatment (prebaking) is performed.

Next, as illustrated in (k) in FIG. 6D, the openings 181 (contact holes) are formed by partially removing each of the planarizing layer 180 and the interlayer insulating layer 170 so as to partially expose each of the source region 142 and the drain region 143.

For example, the planarizing layer 180 is partially removed by exposure and developing. After that, by performing heat treatment (baking), the polyimide material can be baked; specifically, a residual solvent can be volatilized.

The upper aluminum oxide layer 173 and the lower aluminum oxide layer 171 of the interlayer insulating layer 170 can be partially removed by, for example, dry etching using a gas such as boron trichloride ($BCl_3$) Alternatively, the upper aluminum oxide layer 173 and the lower aluminum oxide layer 171 may be partially removed by, for example, wet etching using a tetramethylammonium hydroxide (TMAH) aqueous solution. The intermediate insulating layer 172, which is a silicon oxide film, can be partially removed by dry etching using carbon tetrafluoride ($CF_4$) and oxygen gas ($O_2$).

Lastly, as illustrated in (l) in FIG. 6D, the source electrode layer 190s electrically and physically connected to the source region 142 via an opening 181, and the drain electrode layer 190d electrically and physically connected to the drain region 143 via an opening 181 are formed. More specifically, first, a metal film (source drain metal film) is formed on the planarizing layer 180 by, for example, a sputtering method to fill the contact holes 181. The source electrode layer 190s and the drain electrode layer 190d are formed in a predetermined shape by patterning the formed metal film using a photolithography method and a wet etching method. For example, a MoW/Al/MoW three-layered structure metal film having a total thickness of 500 nm is formed as the source electrode layer 190s and the drain electrode layer 190d.

This is how the TFT substrate 20 illustrated in FIG. 4 can be fabricated.

Advantageous Effects Etc.

Next, a working effect of the TFT substrate 20 according to the present embodiment will be described, including a description of the circumstances that have led to the technique of the present embodiment.

Figure 7:
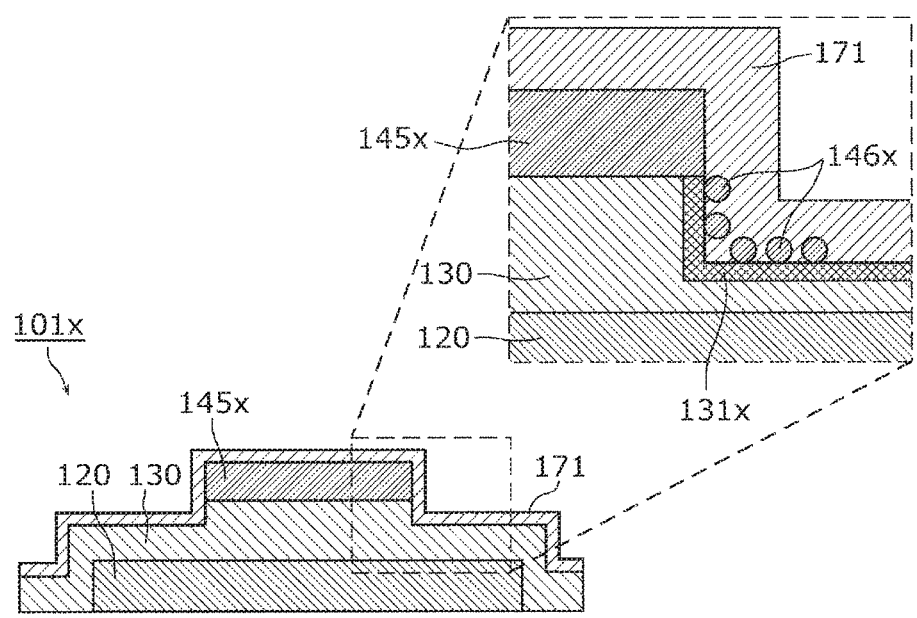
FIG. 7 is a cross sectional view illustrating a configuration of a capacitor of a TFT substrate according to a comparative example.

FIG. 7 is a cross sectional view illustrating a configuration of a capacitor 101x of a TFT substrate according to a comparative example. As illustrated in FIG. 7, the capacitor 101x according to the comparative example is different from the capacitor 101 according to the present embodiment in that an upper electrode layer 145x is smaller than the lower electrode layer 120. In other words, the upper electrode layer 145x does not cover the lower electrode layer 120.

Similar to the oxide semiconductor layer 140 (channel layer), the upper electrode layer 145x is formed using a transparent amorphous oxide semiconductor. Specifically, as in the case of the upper electrode layer 145 according to the present embodiment described with reference to (g) in FIG. 6B, electrical conductivity is given to the upper electrode layer 145x by exposing the upper electrode layer 145x with plasma when patterning the gate insulating film 150a. At this time, as illustrated in FIG. 7, an oxide semiconductor material 146x to which electrical conductivity is given splatters and attaches to the capacitor insulating layer 130.

Since the capacitor insulating layer 130 has become thinner due to overetching, the distance between the electrically conductive oxide semiconductor material 146x and the lower electrode layer 120 is reduced. Consequently, the breakdown voltage of the capacitor 101x is reduced.

Moreover, since the lower aluminum oxide layer 171 is formed on the upper electrode layer 145x, the resistance of the electrically conductive oxide semiconductor material 146x does not increase. Since the low resistance of the oxide semiconductor material 146x is maintained, the breakdown voltage of the capacitor 101x is reduced.

Furthermore, the lower aluminum oxide layer 171 removes oxygen from the silicon oxide film included in the capacitor insulating layer 130. With this, the resistance of a surface layer portion 131x of the capacitor insulating layer 130 decreases. Since the capacitor insulating layer 130 has become thinner due to overetching, the substantial inter-electrode distance of the capacitor 101x is further reduced, thereby reducing the breakdown voltage of the capacitor 101x.

As described above, with the capacitor 101x according to the comparative example, since the upper electrode layer 145x does not cover the lower electrode layer 120, the breakdown voltage of the capacitor 101x is reduced, resulting in a problem that the capacitor 101x is prone to electrical breakdown.

In contrast, the TFT substrate 20 according to the present embodiment includes: the substrate 110; the TFT 100 disposed above the substrate 110; and the capacitor 101 disposed above the substrate 110 and electrically connected with the TFT 100. The capacitor 101 includes: the lower electrode layer 120 disposed above the substrate 110 and including an electrically conductive material as a main component; the upper electrode layer 145 disposed above and opposed to the lower electrode layer 120 and including, as a main component, an oxide semiconductor material to which electrical conductivity is given; and the capacitor insulating layer 130 disposed between the lower electrode layer 120 and the upper electrode layer 145. The extension 121 extending outward from at least a portion of the outer edge of the lower electrode layer 120 in plan view is provided to the lower electrode layer 120. In plan view, the upper electrode layer 145 covers the lower electrode layer 120 except the extension 121. Here, for example, the TFT substrate 20 further includes the lower aluminum oxide layer 171 disposed on the upper electrode layer 145.

Figure 8:
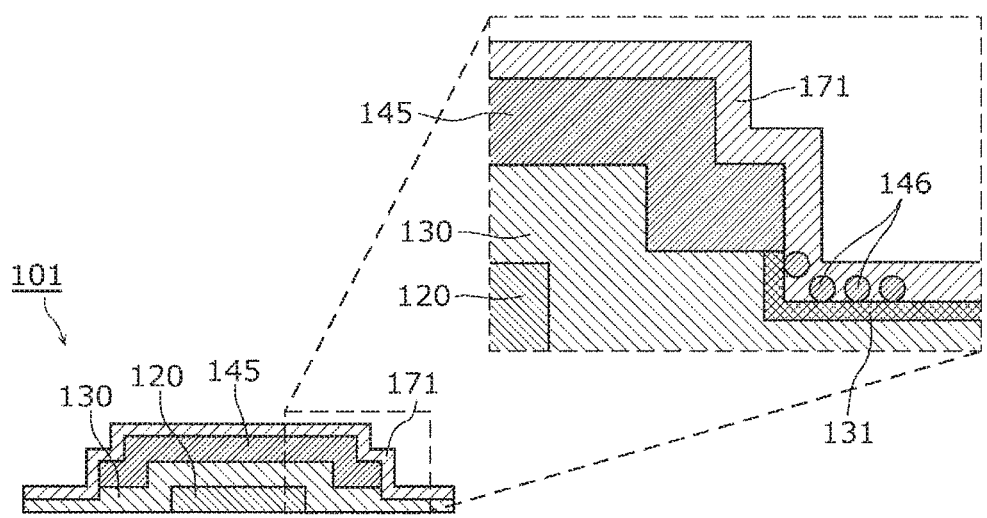
FIG. 8 is a cross sectional view illustrating a configuration of a capacitor of a TFT substrate according to an embodiment.

FIG. 8 is a cross sectional view illustrating a configuration of the capacitor 101 of the TFT substrate 20 according to the present embodiment. In the present embodiment too, an oxide semiconductor material 146 to which electrical conductivity is given splatters and attaches to the capacitor insulating layer 130 as illustrated in FIG. 8. The lower aluminum oxide layer 171 removes oxygen from a surface layer portion 131 of the capacitor insulating layer 130, and thus the resistance of the surface layer portion 131 decreases. The capacitor insulating layer 130 has become thinner due to overetching.

In the present embodiment, since the upper electrode layer 145 covers the lower electrode layer 120, the thin portion of the capacitor insulating layer 130, the surface layer portion 131, and the portion of the capacitor insulating layer 130 to which the oxide semiconductor material 146 is attached are all distant from the lower electrode layer 120. Specifically, the thin portion, the surface layer portion 131, and the portion to which the oxide semiconductor material 146 is attached do not overlap the lower electrode layer 120 in plan view. Accordingly, even if these portions had become electrically conductive, a distance is secured between the upper electrode layer 145 and the lower electrode layer 120, thus inhibiting reduction of the breakdown voltage. With this, according to the present embodiment, it is possible to provide the TFT substrate 20 including the highly reliable capacitor 101.

The inventors fabricated a sample having an inter-electrode distance of 100 nm and the lower electrode layer 120 of 100 μm×100 μm in plan view, and measured a failure rate when a voltage of 100 V is applied between the electrodes. Note that the plan view size of the upper electrode layer 145x according to the comparative example is smaller than that of the lower electrode layer 120 by 2 μm in width, whereas the plan view size of the upper electrode layer 145 according to the present embodiment is larger than that of the lower electrode layer 120 by 2 μm in width. In this case, the failure rate was 20% in the comparative example, and 0% in the present embodiment.

For example, the electrically conductive material included in the lower electrode layer 120 as a main component is titanium or aluminum.

With this, since the lower electrode layer 120 is formed using titanium or aluminum having a high electrical conductivity, it is possible to inhibit, for example, a voltage drop in the plane of the lower electrode layer 120.

For example, the plan view shape of the upper electrode layer 145 is equivalent to a sum of the plan view shape of the lower electrode layer 120 and the plan view shape of an additional region adjacent to the plan view shape of the lower electrode layer 120 and having a predetermined width.

With this, the thin portion of the capacitor insulating layer 130, the surface layer portion 131, and the portion of the capacitor insulating layer 130 to which the oxide semiconductor material 146 is attached can be kept further away from the lower electrode layer 120. As a result, reduction in the breakdown voltage of the capacitor 101 can be inhibited, and electrical breakdown is less likely to occur.

Variation

Hereinafter, a variation of the TFT substrate according to the present embodiment will be described.

Figure 9:
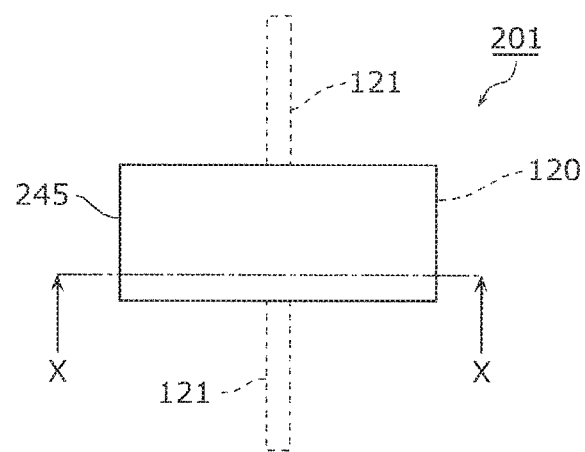
FIG. 9 is a plan view schematically illustrating the electrode shape of a capacitor of a TFT substrate according to a variation of an embodiment.
Figure 10:
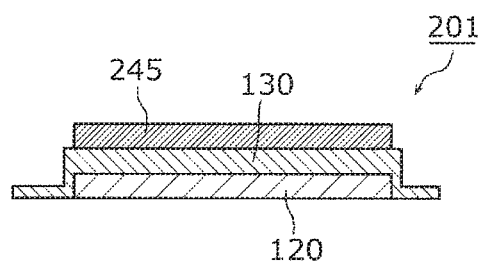
FIG. 10 is a cross sectional view illustrating a configuration of a capacitor of a TFT substrate according to a variation of an embodiment.

FIG. 9 is a plan view schematically illustrating the electrode shape of a capacitor 201 of a TFT substrate according to the present variation. FIG. 10 is a cross sectional view illustrating a configuration of the capacitor 201 of the TFT substrate according to the present variation. Specifically, FIG. 10 illustrates a cross section taken along X-X line in FIG. 9.

The capacitor 201 according to the present variation is different from the capacitor 101 according to the above embodiment in including an upper electrode layer 245 instead of the upper electrode layer 145. In the present variation, the plan view shape of the upper electrode layer 245 and the plan view shape of the lower electrode layer 120 match each other. That is to say, no additional region is provided in the present variation.

With the capacitor 201 according to the present variation too, a distance can be secured between the upper electrode layer 245 and the lower electrode layer 120 as compared to the capacitor 101x according to the comparative example, thus inhibiting reduction of the breakdown voltage of the capacitor 201. Since no additional region is provided in the present variation, it is useful especially when the pixel area is small.

Others

Hereinbefore, the TFT substrate according to the present disclosure has been described based on the above embodiment and the variation thereof, but the present disclosure is not limited to the above embodiment and the variation thereof.

For example, although the electrically conductive material included in the lower electrode layer 120 in the above embodiment is a metal material such as titanium or aluminum, the present disclosure is not limited to this example. Similar to the upper electrode layer 145, an oxide semiconductor material to which electrical conductivity is given may be used as the electrically conductive material.

Furthermore, for example, although the additional region is formed along the entire outer edge of the lower electrode layer 120 in the above embodiment, the present disclosure is not limited to this example. The additional region may be provided only in a portion of the outer edge of the lower electrode layer 120. For example, the additional region may be a band-shaped (straight line-shaped) region provided along only one side of the lower electrode layer 120, or may be an L-shaped region provided along two adjacent sides.

Moreover, for example, although in the above embodiment the organic EL display device 10 has been described as a display device including the TFT substrate 20, the present disclosure is not limited to this example. For example, the TFT substrate 20 according to the above embodiment can be used in other display devices such as a liquid crystal display device.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The thin-film transistor according to the present disclosure can be widely used in a variety of electrical equipment, such as display devices like television sets, personal computers, and cellular phones, or solid-state imaging devices like digital cameras.

The invention claimed is:

1. A thin-film transistor substrate, comprising:
a substrate;
a thin-film transistor above the substrate; and
a capacitor above the substrate and electrically connected with the thin-film transistor,
wherein the capacitor includes:
a first electrode layer disposed above the substrate and including an electrically conductive material as a main component;
a second electrode layer above and opposed to the first electrode layer and including, as a main component, an oxide semiconductor material to which electrical conductivity is given; and
an insulating layer between the first electrode layer and the second electrode layer,
an extension extending outward from at least a portion of an outer edge of the first electrode layer in plan view id provided to the first electrode layer, and
in plan view, the second electrode layer covers the outer edge of the first electrode layer where no extension is formed.

2. The thin-film transistor substrate according to claim 1, further comprising:
an aluminum oxide layer disposed on the second electrode layer.

3. The thin-film transistor substrate according to claim 1, wherein
the electrically conductive material is titanium or aluminum.

4. The thin-film transistor substrate according to claim 1, wherein
a plan view shape of the second electrode layer and a plan view shape of the first electrode layer match each other.

5. The thin-film transistor substrate according to claim 1, wherein
a plan view shape of the second electrode layer is equivalent to a sum of a plan view shape of the first electrode layer and a plan view shape of an additional region adjacent to the plan view shape of the first electrode layer, the additional region having a predetermined width.

6. The thin-film transistor according to claim 1, wherein a distance between the substrate and the first electrode layer is less than a distance between the substrate and a channel of the thin-film transistor.

7. The thin-film transistor according to claim 1, further comprising a splatter element on the insulating layer, wherein the splatter element comprises a same material as the second electrode layer, and the splatter element is completely separate from the second electrode layer.

8. The thin-film transistor according to claim 7, wherein, in plan view, the splatter element exposes an entirety of the first electrode layer.

9. The thin-film transistor according to claim 7, further comprising an aluminum oxide layer over the second electrode layer, wherein the aluminum oxide layer is between the splatter element and the second electrode layer.

10. The thin-film transistor according to claim 7, wherein the splatter element directly contacts the insulating layer.

11. The thin-film transistor substrate according to claim 1, wherein
the electrically conductive material is titanium or aluminum.

12. A thin-film transistor substrate, comprising:
a substrate;
a thin-film transistor above the substrate; and
a capacitor above the substrate and electrically connected with the thin-film transistor,
wherein the capacitor includes:
 a first electrode layer above the substrate and including an electrically conductive material, wherein a distance between the substrate and the first electrode layer is less than a distance between the substrate and a channel of the thin-film transistor;
 a second electrode layer above and opposed to the first electrode layer and including a conductive oxide semiconductor material; and
 an insulating layer between the first electrode layer and the second electrode layer,
 an extension extending from an outer edge of the first electrode layer, and in plan view, the second electrode layer covers the outer edge of the first electrode layer except the extension.

13. The thin-film transistor substrate according to claim 12, further comprising:
an aluminum oxide layer disposed on the second electrode layer.

14. The thin-film transistor substrate according to claim 12, wherein
a plan view shape of the second electrode layer and a plan view shape of the first electrode layer match each other.

15. The thin-film transistor substrate according to claim 12, wherein
a plan view shape of the second electrode layer is equivalent to a sum of a plan view shape of the first electrode layer and a plan view shape of an additional region adjacent to the plan view shape of the first electrode layer, the additional region having a predetermined width.

16. The thin-film transistor according to claim 12, wherein a dimension of the extension in a first direction parallel to a top surface of the substrate is less than a dimension of the first electrode layer in the first direction.

17. The thin-film transistor according to claim 12, further comprising a splatter element on the insulating layer, wherein the splatter element comprises a same material as the second electrode layer, and the splatter element is completely separate from the second electrode layer.

18. The thin-film transistor according to claim 17, wherein, in plan view, the splatter element exposes an entirety of the first electrode layer.

19. The thin-film transistor according to claim 17, further comprising an aluminum oxide layer over the second electrode layer, wherein the aluminum oxide layer is between the splatter element and the second electrode layer.

20. The thin-film transistor according to claim 17, wherein the splatter element directly contacts the insulating layer.

* * * * *